United States Patent [19]
Sugino

[11] Patent Number: 5,121,705
[45] Date of Patent: Jun. 16, 1992

[54] LOADING LOCK FOR CHEMICAL VAPOR DEPOSITION APPARATUS

[75] Inventor: Masao Sugino, Tokyo, Japan

[73] Assignee: MBK Microtek Inc., Tokyo, Japan

[21] Appl. No.: 745,415

[22] Filed: Aug. 15, 1991

[30] Foreign Application Priority Data

Apr. 5, 1991 [JP] Japan .................. 3-72766

[51] Int. Cl.⁵ .................................. C23C 16/00
[52] U.S. Cl. ........................ 118/719; 118/725; 118/729; 414/217
[58] Field of Search .......... 118/719, 725, 729; 414/217

[56] References Cited

U.S. PATENT DOCUMENTS

| | | | |
|---|---|---|---|
| 4,640,223 | 2/1987 | Dozier | 118/719 |
| 4,962,726 | 10/1990 | Matsushita | 118/719 |
| 4,989,540 | 2/1991 | Fuse | 118/719 |
| 5,058,526 | 10/1991 | Matsushita | 414/217 |

FOREIGN PATENT DOCUMENTS 3-30320 2/1991 Japan .

*Primary Examiner*—Richard Bueker
*Attorney, Agent, or Firm*—Burns, Doane, Swecker & Mathis

[57] ABSTRACT

A loading lock for a chemical vapor deposition apparatus comprises three chambers: an outer chamber for introduction and removal of substrates, a reaction chamber for forming thin films on the surfaces of the substrates and an intermediate chamber disposed between the outer chamber and the reaction chamber. The intermediate chamber keeps the reaction chamber in an air-tight state isolated from the atmosphere side at all times. As much of the mechanism for internal conveyance of the substrates as possible is located externally. This arrangement prevents oxidization of the substrate surfaces by air entering the apparatus during introduction and removal of the substrates. It also prevents generation inside the chambers of metallic contaminants, particles and the like which might adhere to the substrate surfaces.

5 Claims, 7 Drawing Sheets

PRIOR ART

PRIOR ART

LOADING LOCK FOR CHEMICAL VAPOR DEPOSITION APPARATUS

BACKGROUND OF THE INVENTION

1. Field of the Invention

This invention relates to a chemical vapor deposition (CVD) apparatus, more particularly to a loading lock for maintaining the air-tight state of the reaction chamber of such an apparatus.

2. Prior Art Statement

The well-known upright low-pressure chemical vapor deposition (LPCVD) apparatus today constitutes a highly important piece of equipment in the semiconductor production process. This apparatus is typically of the structure shown in FIG. 7. As illustrated, the reaction chamber 2A of the apparatus is formed as a space enclosed by a quartz tube 2 which in turn enclosed within a peripheral heater 1. The quartz tube 2 is supported on stainless steel manifold 6, via a vacuum seal O-ring 5A. The manifold 6 is mounted on a stainless steel support plate 9, via a seal 5B. A quartz carrier 4 for holding semiconductor substrates 3 is supported by a stainless steel seal plate 10 directly connected with a lifting support 11 so that the seal plate 10 can be moved vertically by a lifting mechanism 11'. When raised to its upper limit, the seal plate 10 comes in contact with a seal 5C so as to establish a vacuum seal between itself and the support plate 9. The vacuum chamber defined by the quartz tube 2, manifold 6 and seal plate 10 is evacuated by an evacuator 7' via an evacuation port 7. During the deposition process the vacuum chamber is ordinarily maintained at a pressure of about 0.5 Torr and reaction gas is supplied thereto through a gas feed port 8. After the semiconductor substrates 3 are sufficiently heated up by the peripheral heater 1, the reaction gas atmosphere is established in the reaction chamber properly, giving rise to a thermochemical reaction that produces various types of thin films on the surfaces of the semiconductor substrates 3.

Another conventional apparatus having two quartz tubes disposed one inside the other is also known. Since the manner in which deposition is conducted in this apparatus is essentially the same as that in the single-tube type apparatus shown in FIG. 7, however, it will not be explained further here.

In the upright LPCVD apparatus of the foregoing structure, the reaction chamber has to be once restored to atmospheric pressure before the quartz carrier loaded with silicon substrates or the like is loaded into the reaction chamber and then again before it is removed therefrom after completion of the deposition processing. As a result, atmospheric air is allowed to enter the reaction chamber before and after deposition processing and, moreover, the substrates or the like are directly exposed to atmospheric air while still at a high temperature after processing. This causes the following three problems.

First, at the time of being removed from the reaction chamber the surfaces of the substrates or the like, which are still at a high temperature, are oxidized by atmospheric air and moisture. Second, reaction material deposited on the inner wall of the quartz tube (the reaction chamber) is similarly oxidized and becomes a cause for the release of particles into the chamber atmosphere. Third, air remaining in the reaction chamber at the time the substrates and quartz carrier are loaded (inserted) causes the surfaces of the substrates to be oxidized before the start of the deposition process.

For overcoming these problems, it has been proposed to use a double-chamber system in which a loading lock is constituted by providing an outer chamber in addition to the reaction chamber. A typical example of this arrangement is shown in FIG. 8. As illustrated, the reaction chamber 2' formed within a quartz tube 2" is configured in the same manner as that in the apparatus shown in FIG. 7. Differently from the earlier arrangement, however, a gate valve 22 is provided immediately beneath the manifold 6" and a vacuum chamber 24 is provided below the gate valve 22, via a vacuum seal 23. The interior of the vacuum chamber 24 constitutes an outer chamber 24' which is evacuated to a vacuum state through an evacuation port 25 connected with an evacuator 25'. In the illustrated arrangement, the reaction chamber 2' and the outer chamber 24' can be sealed off from each other by the gate valve 22. When the substrates are to be removed from the reaction chamber 2' upon completion of deposition processing, a lifting mechanism 26 is operated to lower the quartz carrier 4" to the lowered position 27 indicted by chain lines in the drawing, whereafter the gate valve 22 is closed to seal off the reaction chamber 2'. The outer chamber 24' is then restored to atmospheric pressure and a door 28 is opened to allow the substrates to be taken out.

Introduction of the quartz carrier 4" into the reaction chamber 2' after substrates have been mounted thereon is carried out by closing the outer chamber door 28, evacuating the outer chamber 24' to a sufficient degree of vacuum, opening the gate valve 22, and operating the lifting mechanism 26 to raise the seal plate 10".

Even this double-chamber loading lock system, however, has the following problems.

One is that the outer chamber has to be once returned to atmospheric pressure during loading and unloading of the substrates. Even though the outer chamber is evacuated again after introduction of the substrates, a certain amount of residual air unavoidably remains. By way of example, assume that air molecules are present in atmospheric air at an average of $2.68 \times 10^{19}$ molecules/cm$^3$. In this case even if a high vacuum on the order of $10^{-6}$ is achieved, air molecules will still remain in the outer chamber on the order of $10^{10}$ molecules/cm$^3$. It is thus impossible to prevent oxidation of the substrate surfaces by the residual air.

Another is that the lifting mechanism is located inside the outer chamber so that metallic contaminants, particles and the like from this mechanism will possibly adhere to the substrate surfaces.

OBJECT AND SUMMARY OF THE INVENTION

An object of this invention is to provide a loading lock for a chemical vapor deposition apparatus which enables a very high degree of prevention of air invasion and the presence of residual air as well as a high degree of prevention of the generation of contaminants and particles by mechanical drive members.

For achieving this object the present invention provides a loading lock for a chemical deposition apparatus employing a three-chamber system wherein an intermediate chamber is disposed between the outer chamber for introduction and removal of the substrates and the reaction chamber for forming a thin film on the surface of the substrates by chemical vapor deposition. The intermediate chamber serves as a buffer chamber arranged to be maintained in an air-tight state when the outer chamber is opened to the atmosphere for introduction or removal of substrates and thus to completely isolate the reaction chamber from the atmosphere.

In addition, the invention employs an arrangement in which the members of the conveyance means for conveying the substrates between the outer chamber and the reaction chamber are, to the highest degree possible, disposed outside of the intermediate chamber, whereby the adherence to the substrate surfaces of particles and the like generated from the members constituting the conveyance means is prevented.

Specifically, the loading lock for a chemical deposition apparatus according to the invention comprises an outer chamber having an opening/closing member for introduction and removal of substrates, the outer chamber being in a substantially air-tight state when the opening/closing means is closed; a substantially completely air-tight reaction chamber for forming a thin film on the surfaces of the substrates; a substantially air-tight intermediate chamber having an outer chamber side communication port communicating with the outer chamber, a reaction chamber side communication port communicating with the reaction chamber and sealing means for sealing the communication ports; and conveyance means for conveying substrates introduced into the outer chamber through the opening/closing member through the intermediate chamber into the reaction chamber and for conveying the substrates processed in the reaction chamber through the intermediate chamber to the outer chamber.

Further the substrate conveyance means in this invention comprises a substrate mount for attachment of the substrates, a first drive mechanism for reciprocal movement of the substrate mount between the outer chamber and the intermediate chamber along a path passing through the outer chamber side communication port and a second drive means for reciprocal movement of the substrate mount conveyed into the intermediate chamber through the outer chamber side communication port by the first drive mechanism between the intermediate chamber and the reaction chamber along a path passing through the reaction chamber side communication port.

The power source of the first drive mechanism is located outside the outer chamber and a power transmission member for transmitting the driving force of the power source to the substrate mount extends into the outer chamber through a hole formed in a wall of the outer chamber. The hole and the interior of the outer chamber are substantially air-tightly partitioned from each other by a rotary magnetic seal unit disposed around the periphery of the power transmission member.

The power source of the second drive mechanism is located outside the intermediate chamber and a power transmission member for transmitting the driving force of the power source to the substrate mount extends into the intermediate chamber through a hole formed in a wall of the intermediate chamber. The hole and the interior of the intermediate chamber are substantially air-tightly partitioned from each other by a bellows extensible in the direction of movement of the power transmission member and a seal means disposed between the bellows and the power transmission member.

The loading lock for a CVD apparatus according to this invention thus comprises three chambers, the outer chamber, the intermediate chamber and the reaction chamber, so that by constantly maintaining the intermediate chamber in a highly vacuumized state it is possible to prevent invasion of air into the reaction chamber to a very high degree and thus to prevent the generation of particles in the reaction chamber by air-induced oxidation. Moreover, the substrates are conveyed into the reaction chamber from the highly vacuumized intermediate chamber and are removed from the reaction chamber into the highly vacuumized intermediate chamber, whereby oxidation of the substrate surfaces can be prevented.

In addition, since the members of the carrier drive system for conveying substrates are to the greatest degree possible located outside of the intermediate chamber, the possibility of the surface of the substrates being contaminated by particles and the like generated by these mechanical drive members is minimized.

The above and other features of the present invention will become apparent from the following description made with reference to the drawings.

DETAILED DESCRIPTION OF THE PREFERRED EMBODIMENTS

The invention will now be explained in detail with reference to the attached drawings.

Figure 1:
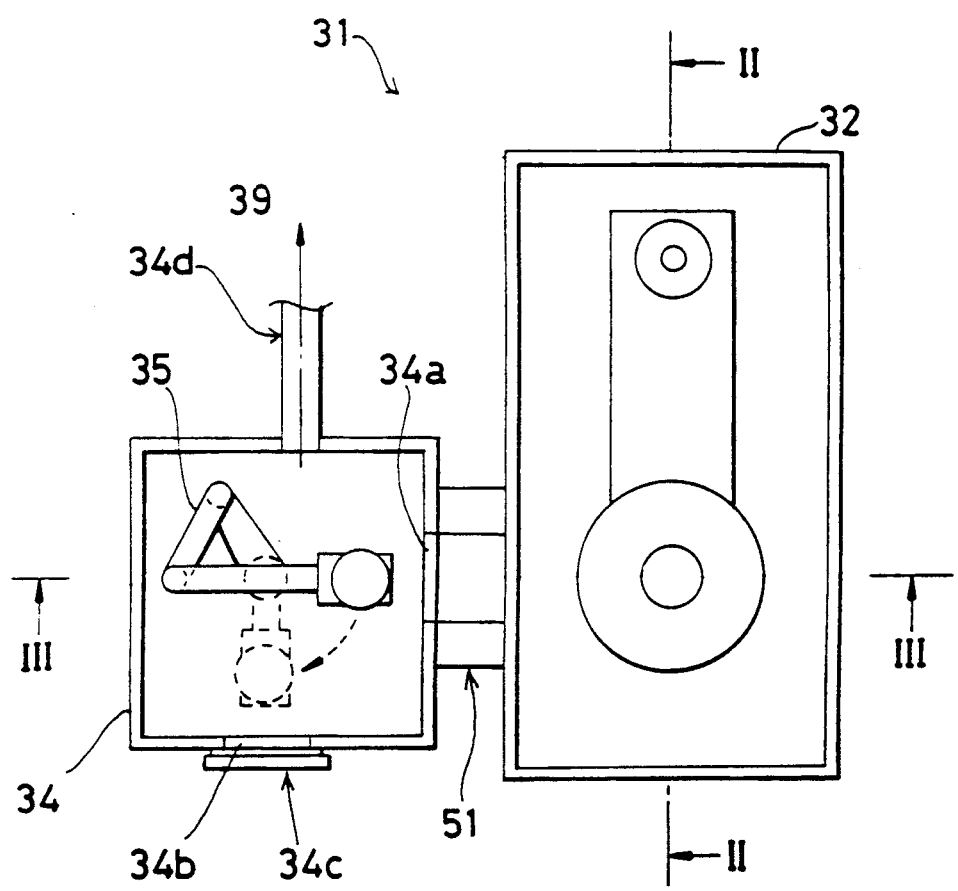
FIG. 1 is a plane view of a first embodiment of a CVD apparatus equipped with a loading lock according to this invention.
Figure 2:
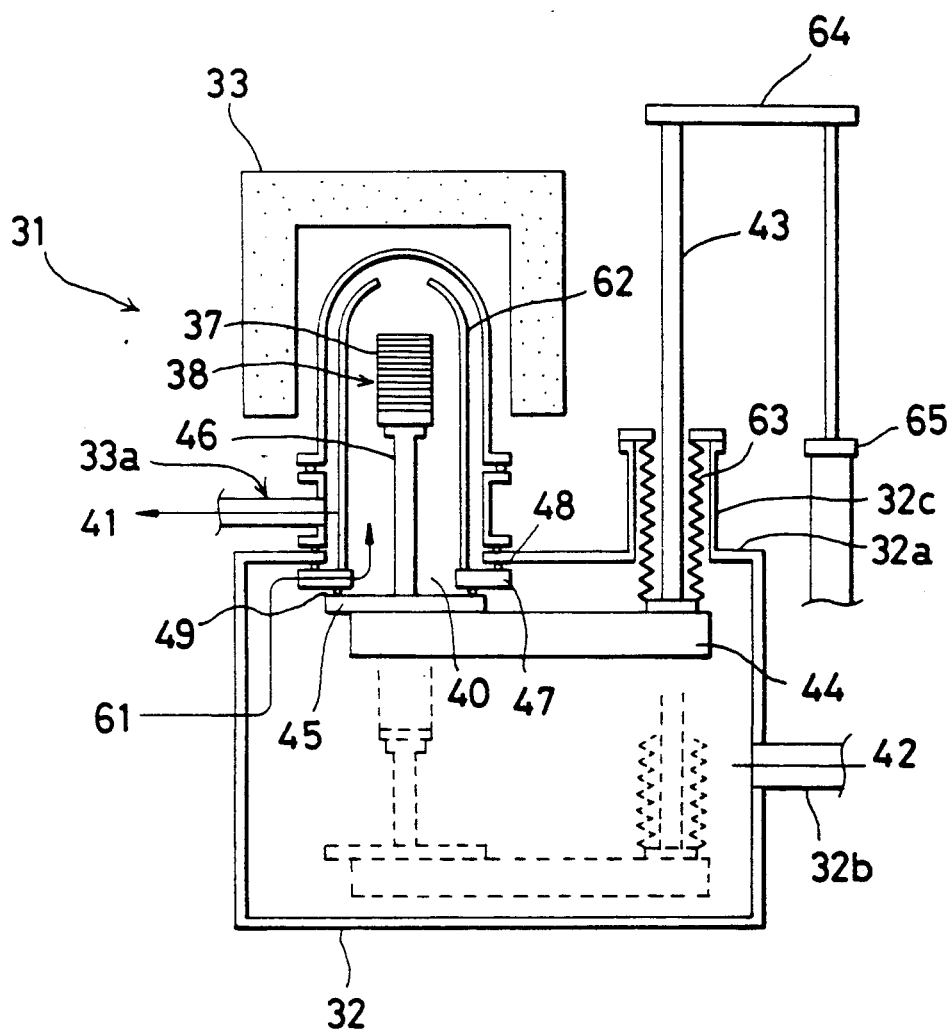
FIG. 2 is a schematic sectional view taken along line II—II in FIG. 1.
Figure 3:
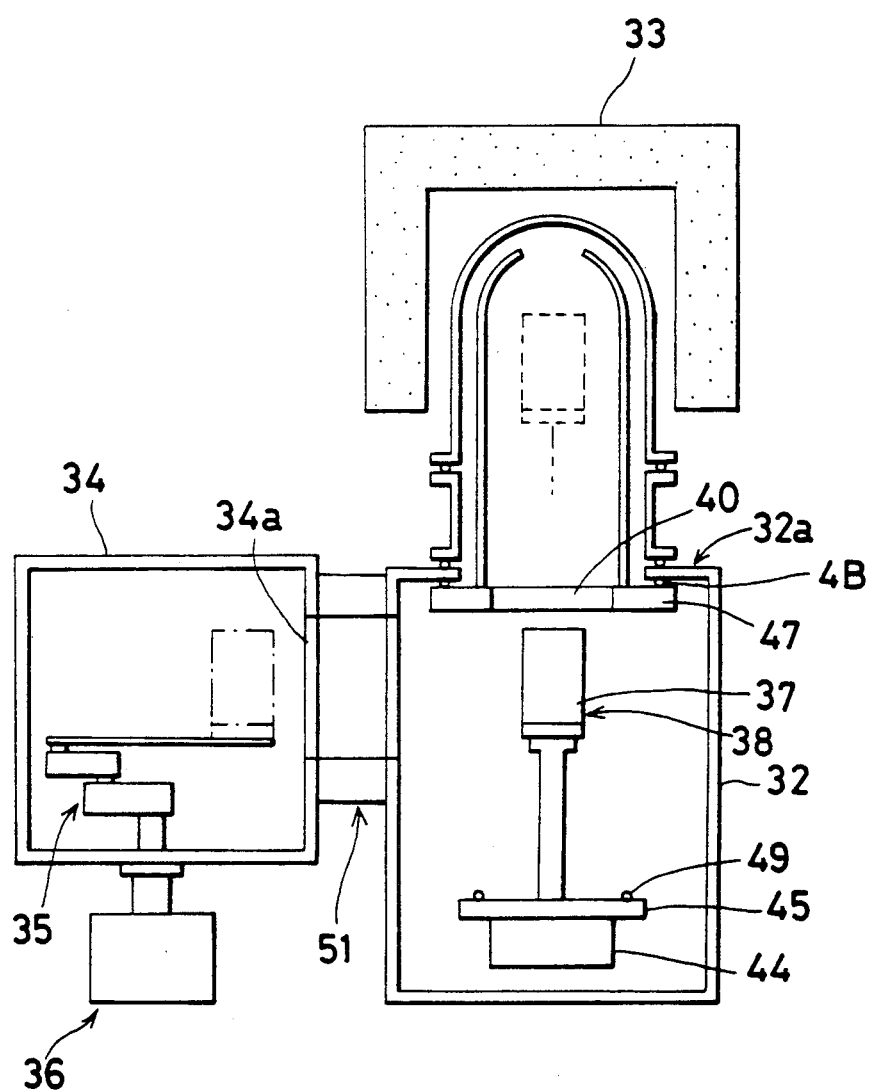
FIG. 3 is a schematic sectional view taken along line III—III in FIG. 1.

FIGS. 1 to 3 show a first embodiment of the CVD apparatus equipped with a loading lock according to this invention.

Structure

The CVD apparatus, designated by reference numeral 31, comprises a box-shaped intermediate chamber 32 made of stainless steel, a reaction chamber 33 standing upright on the upper wall 32a of the intermediate chamber 32 and an outer chamber 34 disposed laterally of the intermediate chamber 32. The intermediate chamber 32 and the outer chamber 34 are connected via a gate valve 51 serving as a means for sealing an outer chamber side communication port 34a of the outer chamber 34.

Box-like in overall configuration, the outer chamber 34 has a rectangular opening in the side wall thereof on the side of the intermediate chamber 32. This opening constitutes the outer chamber side communication port 34a communicating with the intermediate chamber 32. The gate vale 51 is disposed at the outer chamber side communication port 34a and when closed air-tightly seals the communication port 34a. As shown in FIG. 1, one side wall of the outer chamber 34 has an opening 34b for introduction and removal of substrates 37. The opening 34b is provided with a door 34c. Another wall of the outer chamber 34 is provided with an evacuation port 34d connected with an evacuator 39 for vacuumizing the outer chamber 34.

A first drive sub-mechanism 35 is disposed inside the outer chamber 34 for conveying the substrates 37 and a substrate mount 38 back and forth between the outer chamber 34 and the intermediate chamber 32 via a path passing through the outer chamber side communication port 34a and the gate valve 51. A power source 36 for driving the first drive sub-mechanism 35 is disposed directly beneath the outer chamber 34. A first power transmission member extends from the power source 36 through a hole in the bottom wall of the outer chamber 34 and connects with the first drive sub-mechanism 35 for supplying driving force from the power source 36 thereto. The first drive sub-mechanism 35, the power source 36 and the first power transmission member together constitute a first drive mechanism. A rotary magnetic seal unit is disposed between this hole and the power transmisson member for maintaining the outer chamber 34 in an air-tight condition.

Since the first drive sub-mechanism 35 can be a commercially available vacuum conveyor robot and the reaction chamber 33 is basically of the conventional structure, these components will not be described in detail here.

The reaction chamber 33 has a bottom opening in air-tight communication with an opening at the forward side of the upper wall 32a of the intermediate chamber 32. This portion constitutes a reaction chamber side communication port 40 communicating the reaction chamber 33 with the intermediate chamber 32. As shown in FIG. 2, an evacuation port 33a formed in the outer wall of the reaction chamber 33 is connected with an evacuator 41.

An evacuation port 32b formed midway of the height of one side wall of the intermediate chamber 32 is connected with an evacuator 42. The rearward side of the upper wall 32a of the intermediate chamber 32 is formed with a substantially upright cylindrical projection 32c through the center of which passes a vertical lift shaft 43. The lower end of the lift shaft 43 is fixed to the upper side of a horizontal support beam 44 provided in the intermediate chamber 32, near the rearward end thereof. A disc-shaped seal plate 45 is fixed to the upper surface of the horizontal support bean 44 near the forward end thereof so as to be positioned concentrically with the reaction chamber side communication port 40. Fixed to the upper surface of the seal plate 45 is a vertical support rod 46 having the substrate mount 38 at the upper end thereof. The substrate mount 38 is able to carry a large number of substrates 37. The horizontal beam support 44, the seal plate 45 and the support rod 46 together constitute a second drive sub-mechanism.

Immediately beneath the periphery of the reaction chamber side communication port 40 formed in the upper wall 32a of the intermediate chamber 32 is provided a gas ring 47 supporting a quartz reaction tube 62. Reaction gas is introduced into the quartz reaction tube 62 through the gas ring 47. An air-tight seal is maintained between the gas ring 47 and the intermediate chamber upper wall 32a by the presence of an O-ring 48. An O-ring 48 is also concentrically attached to the intermediate chamber side of the gas ring 47. When the seal plate 45 is at its uppermost position as shown in solid lines in FIG. 2, an air-tight seal is maintained between the seal plate 45 and the gas ring 47 by the presence of an O-ring 49.

A stainless steel bellows 63 is provided around the lift shaft 43 so as to be extensible/contractible in the axial direction thereof. The upper end of the bellows 63 is air-tightly attached to the upper end of the cylindrical projection 32c and the lower end thereof is air-tightly attached to the horizontal support beam 44. The upper end of the lift shaft 43 is fixed to one end of a horizontal support plate 64 extending perpendicularly thereto. The other end of the support plate 64 is fixed to a lifting mechanism 65. The second drive sub-mechanism, the horizontal support plate 64 and the lifting mechanism 65 together constitute a second drive mechanism.

In the CVD apparatus of this construction, communication between the outer chamber 34 and the intermediate chamber 32 can be established and shut off by opening and closing the gate valve 51. For shutting off communication between the intermediate chamber 32 and the reaction chamber 33 it suffices to operate the lifting mechanism 65 for raising the lift shaft 43 to its uppermost position and thus cause the seal plate 45 to press onto the gas ring 47 with the O-ring 49 sandwiched therebetween for providing an air-tight seal.

Operation

The procedure for operating the CVD apparatus according to this embodiment will now be explained.

(1) First the intermediate chamber 32 and the reaction chamber 33 are evacuated to a high degree of vacuum.

(2) The door 34c of the outer chamber 34 is opened and the substrates 37 are loaded onto the substrate mount 38. The door 34c is then closed and evacuation of the outer chamber 34 is commenced.

(3) After a vacuum of the prescribed degree has been established in the outer chamber 34, the gate valve 51 is opened and the first drive mechanism is opened to convey the substrate mount 38 carrying the substrates 37 into the intermediate chamber 32.

(4) The second drive mechanism is operated to lower the seal plate 45 to the position for transferring the substrate mount 38. Specifically, the seal plate is lowered to its lowermost position indicated by dashed lines in FIG. 2. Once the seal plate has reached the transfer position, the substrate mount 38 is conveyed from the first drive sub-mehcanism 35 side to the second drive sub-mechanism side.

(5) After the transfer of the substrate mount 38 has been completed, the first drive sub-mechanism 35 is retracted into the outer chamber 34 whereafter the second drive mechanism is operated to raise the seal plate 45 to its uppermost position and seal the reaction chamber side communication port 40 (as shown in solid lines in FIG. 2).

(6) CVD processing is conducted in the reaction chamber 33 and when completed the second drive mechanism is operated to lower the substrate mount 38 to the position for transferring it to the first drive sub-mechanism 35.

(7) After the transfer of the substrate mount 38 to the first drive sub-mehcanism 35 has been completed, the first drive mechanism is operated to return the substrate mount 38 to the outer chamber 34. After this, the gate valve 51 is closed.

(8) After the outer chamber 34 has been returned to atmospheric pressure, the door 34c is opened and the substrates 37 are removed.

The CVD apparatus according to this embodiment has the following effects.

(1) Since the CVD apparatus is provided with a three-chamber loading lock comprising the outer chamber, intermediate chamber and reaction chamber, it is possible to maintain the intermediate chamber in a highly vacuumized state at all times. As a result, invasion of air into the reaction chamber can be prevented to a very high degree, which in turn makes it possible to prevent the generation of particles by air-induced oxidization. Moreover, since the operations for introducing the substrates into and removing them from the reaction chamber are carried out in the vacuumized intermediate chamber, oxidation of the substrate surfaces can be prevented.

(2) Since the drive system of the lifting mechanism (second drive mechanism) is located outside the intermediate chamber, generation within the intermediate chamber of contaminants and particles from the mechanical drive members can be prevented.

(3) The stainless steel seal plate supporting the substrate mount itself functions as a vacuum seal between the reaction chamber and the intermediate chamber. It is therefore unnecessary to provide a gate valve as a seal means, which is advantageous because gate valves are expensive and poor in heat resistance.

(4) The vacuumizing cycle needs to be carried out only with respect to the outer chamber. Moreover, since the volume of the outer chamber is relatively small, the energy efficiency is better than that in the case of a two-chamber loading lock, whereby the operating cost becomes lower.

While this embodiment calls for establishment of a vacuum atmosphere in the respective chambers, this is not a requirement. Alternatively, it is possible for example to introduce a gas appropriate for the process being conducted (e.g. $N_2$, Ar or the like) into the reaction chamber, intermediate chamber and outer chamber either through a common path or through a separate path for each chamber. Moreover, since it is also possible to set the pressure in the respective chambers at a level between vacuum and one atmosphere or more, the CVD apparatus can be applied to a wide range of different processes. It is also possible to install a pre-treatment chamber ahead of the outer chamber. In this case it becomes possible to subject the substrates to anhydrous HF etching or some other pre-treatment in the pre-treatment chamber and the CVD processing can then be conducted without need for again bringing the substrates in contact with atmospheric air.

Other embodiments

In the embodiment described in the foregoing, the reaction chamber is of the conventional structure and a vacuum seal is formed between the quartz tube and the stainless steel manifold. With this arrangement, it is sometimes difficult to establish a high vacuum seal and, moreover, the durability under high temperature may be insufficient.

Figure 4:
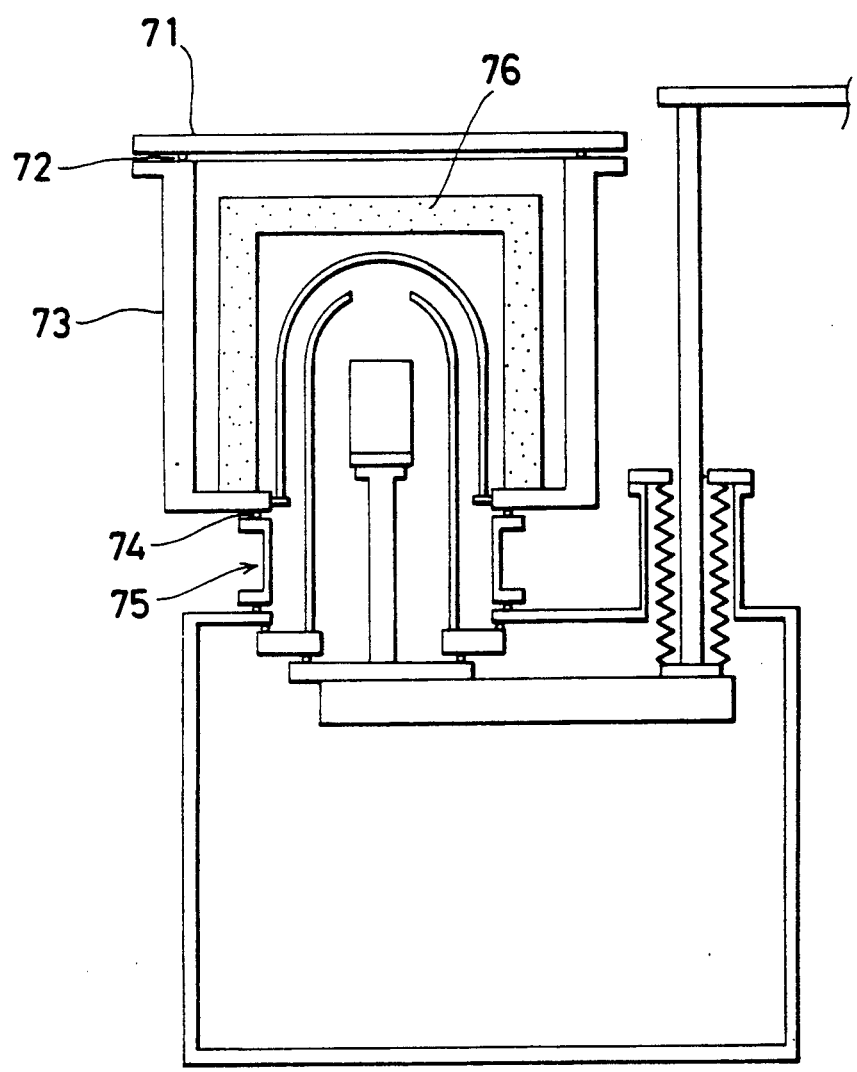
FIG. 4 is a schematic sectional view for explaining a modification of the apparatus of FIG. 1.

FIG. 4 shows an embodiment of the invention designed for overcoming these problems. As illustrated, a cylindrical shroud 73 made of stainless steel and equipped with a water cooling mechanism is provided so as to enclose the reaction chamber 33 and its heater 76. The shroud 73 is kept air tight by a top plate 71 and an intervening O-ring 72 for establishing a vacuum seal. The bottom of the shroud 73 is in communication with a stainless steel manifold 75 via an O-ring 74 for establishing a vacuum seal. This arrangement enables the establishment of high vacuum seals since all of the vacuum seals are formed between metal and metal. It also mekes it possible to carry out high-temperature deposition processing at 800°–1200° C.

This embodiment can therefore be used for carrying out a silicon epitaxial growth process, silicon-carbide film formation, titanium-carbide film formation and other such high-temperature processes in a high-purity atmosphere shut off from the ambient atmospheric air.

In the two embodiments just described, a single CVD apparatus is formed of three chambers, namely the outer chamber, the intermediate chamber and the reaction chamber. For realizing a wider range of applications and improving productivity, however, it is preferable to adopt one of the arrangements illustrated in FIGS. 5 and 6.

Figure 5:
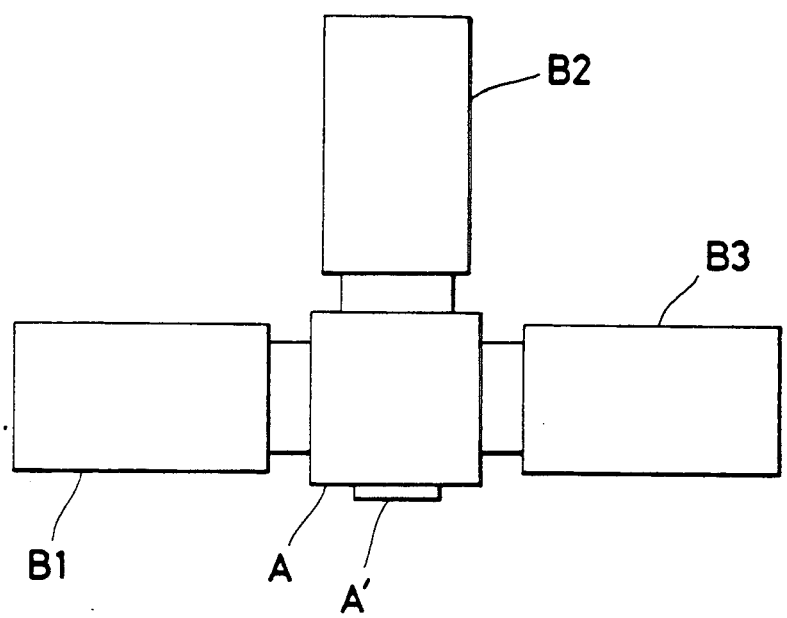
FIG. 5 is a schematic sectional view for explaining another modification of the apparatus of FIG. 1.

In FIG. 5, A is an outer chamber and the loading and unloading of the substrates is conducted through a front door A'. Onto the remaining three sides of the outer chamber A, are attached three intermediate chamber/reaction chamber pairs B1, B2 and B3. The three intermediate chamber/reaction chamber pairs B1–B3 share the single outer chamber A. The outer chamber, intermediate chambers and reaction chambers are of the same structure as those of the earlier embodiments and will not be explained again here.

This arrangement enables single thin film formation to be carried out with enhanced efficiency. It is also capable of conducting multi-layer formation of different types of films.

Figure 6:
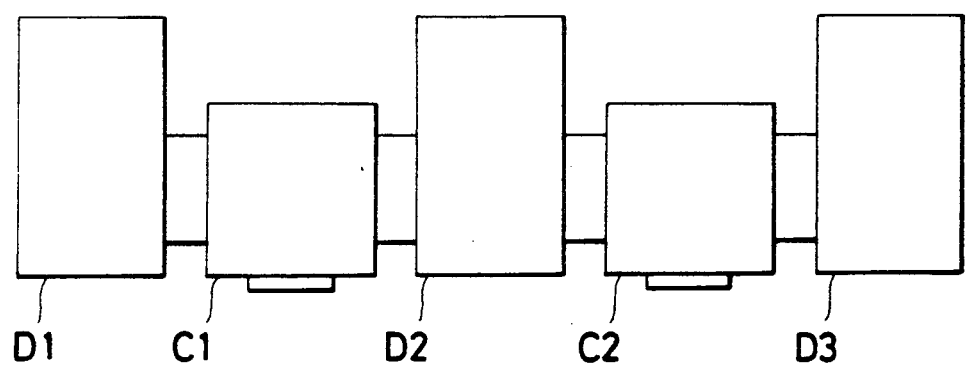
FIG. 6 is a schematic sectional view for explaining another modification of the apparatus of FIG. 1.
Figure 7:
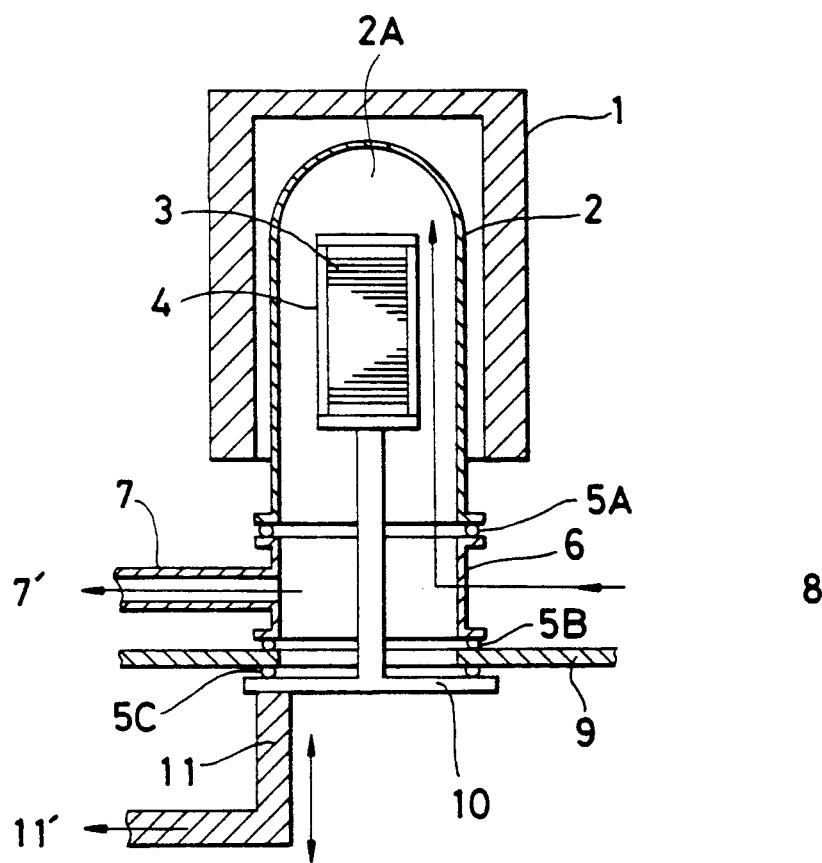
FIG. 7 is a schematic sectional view showing the structure of a conventional CVD apparatus; and, FIG. 8 is a schematic sectional view showing the structure of another conventional CVD apparatus.
Figure 8:
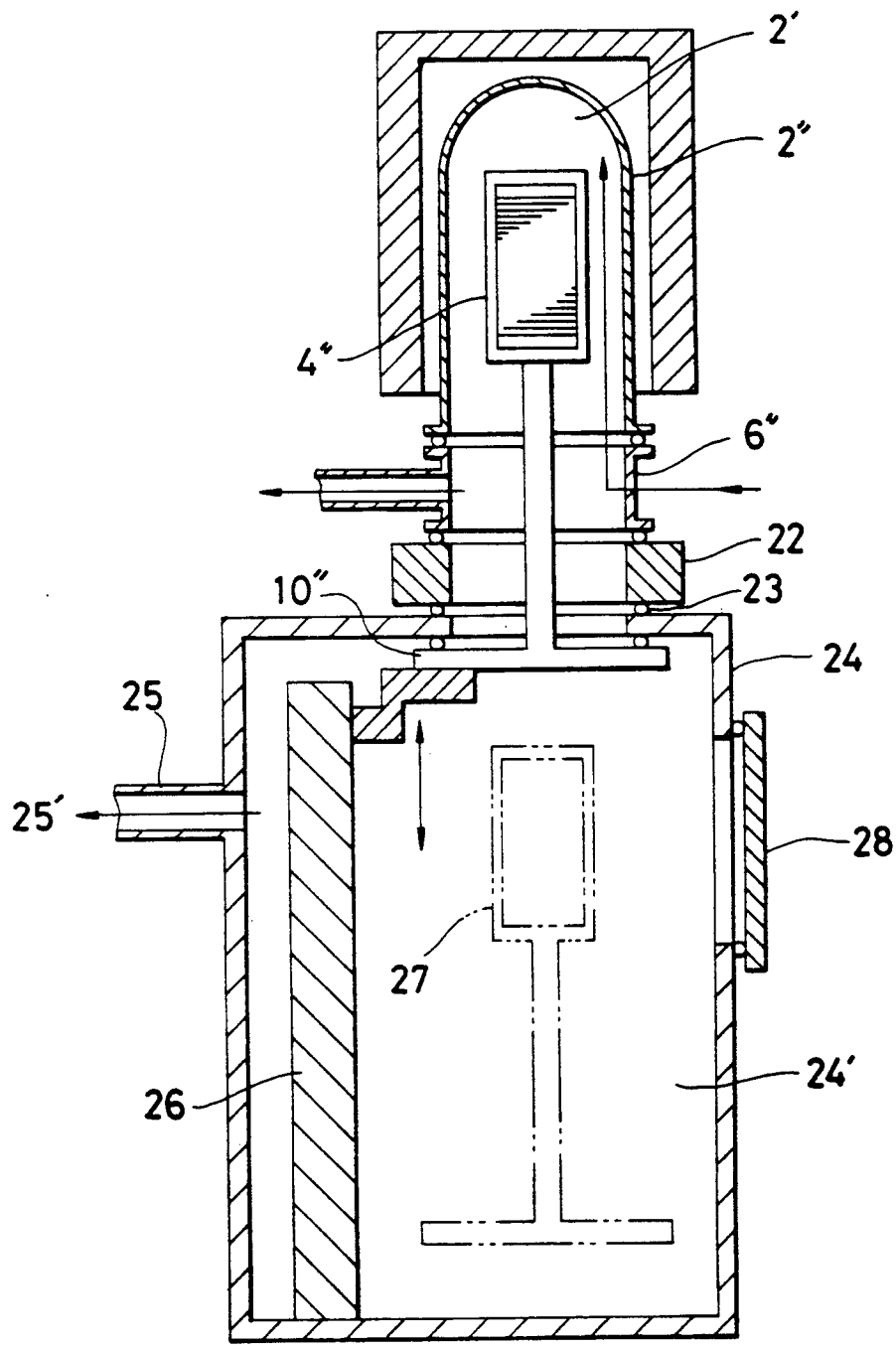

FIG. 6 shows still another embodiment of the invention. In this figure, C1 and C2 are outer chambers and D1, D2, D3 are intermediate chamber/reaction chamber pairs. This arrangement provides the same effects as the embodiment of FIG. 5, with the additional advantage of providing greater freedom in the process sequence. The outer chambers, intermediate chambers and reaction chambers of this embodiment are also of the same structure as those of the earlier embodiments and will not be explained again here.

While the embodiments described in the foregoing all relate to the upright LPCVD apparatus, the invention is also applicable to the loading locks of a wide range of other types of processing apparatuses including those used for epitaxial growth, organometallic CVD, tungsten and other metallic CVD, plasma CVD, III–V Group CVD, diffusion furnace processes, etc.

I claim:

1. In a chemical vapor deposition apparatus which employs chemical vapor deposition for forming a thin film on a surface of a silicon wafer or other such substrate in a vacuum atmosphere substantially isolated from the atmosphere, a loading lock for a chemical vapor deposition apparatus comprising:
   at least one outer chamber having an opening/closing means for introduction and removal of a substrate, the outer chamber being in a substantially air-tight state when the opening/closing means is closed,
   at least one substantially air-tight reaction chamber for forming a thin film on a surface of the substrate,
   at least one substantially air-tight intermediate chamber having an outer chamber side communication port communicating with the outer chamber, a reaction chamber side communication port communicating with the reaction chamber and sealing means for sealing the communication ports, and at least one conveyance means for conveying the substrate introduction into the outer chamber through the opening/closing member through the intermediate chamber into the reaction chamber and for conveying the substrate after being processed in the reaction chamber through the intermediate chamber to the outer chamber;

the conveyance means having a substrate mount for attachment of the substrate, a first drive mechanism for reciprocal movement of the substrate mount between the outer chamber and the intermediate chamber along a path passing through the outer chamber side communication port and a second drive means for reciprocal movement of the substrate mount conveyed into the intermediate chamber through the outer chamber side communication port by the first drive mechanism between the intermediate chamber and the reaction chamber along a path passing through the reaction chamber side communication port;

the first drive mechanism having first drive sub-mechanism located in the outer chamber, a power source located outside the outer chamber and a power transmission member for transmitting driving force of the power source to the first drive sub-mechanism extending into the outer chamber through a hole formed in a wall of the outer chamber, this hole and the interior of the outer chamber being substantially air-tightly partitioned from each other by a rotary magnetic seal unit disposed around the periphery of the power transmission member;

the second drive mechanism having a second drive sub-mechanism located in the intermediate chamber, a power source located outside the intermediate chamber and a power transmission member for transmitting driving force of the power source to the second drive sub-mechanism extending into the intermediate chamber through a hole formed in a wall of the intermediate chamber, this hole and the interior of the intermediate chamber being substantially air-tightly partitioned from each other by a bellows extensible in a direction of movement of the power transmission member and a seal means disposed between the bellows and the power transmission member.

2. A loading lock for a chemical vapor deposition apparatus according to claim 1, wherein the second drive sub-mechaninsm comprises a seal member capable of sealing the reaction chamber side communication port, a support member supportiong the substrate mount on this seal member and a connecting member connecting this seal member with the power source of the second drive mechanism.

3. A loading lock for a chemical vapor deposition apparatus according to claim 1 or 2, wherein the reaction chamber is enclosed by a cylindrical metal shroud equipped with a water cooling mechanism, the shroud having an upper opening sealed by a metal top plate and an intervening seal member and a bottom opening connected via a seal member with a metal manifold constituting a communication passage between the reaction chamber and the intermediate chamber.

4. A loading lock for a chemical vapor deposition apparatus according to claim 1 or 2, wherein a plurality of intermediate chamber/reaction chamber pairs each consisting of an intermediate chamber having a second drive mechanism and a reaction chamber are disposed around an outer chamber, an outer chamber side communication port being provided for communication between the outer chamber and each pair, a seal means being provided for sealing each outer chamber side communication port, and the first drive mechanism being arranged to convey the substrate mount reciprocally between the outer chamber and each pair with each pair being maintained in an air-tight state.

5. A loading lock for a chemical vapor deposition apparatus according to claim 3, wherein a plurality of intermediate chamber/reaction chamber pairs each consisting of an intermediate chamber having a second drive mechaninsm and a reaction chamber are disposed around an outer chamber, an outer chamber side communication port being provided for communication between the outer chamber and each pair, a seal means being provided for sealing each outer chamber side communication port, and the first drive mechanism being arranged to convey the substrate mount reciprocally between the outer chamber and each pair with each pair being maintained in an air-tight state.

* * * * *